United States Patent
Chong et al.

(10) Patent No.: US 6,912,164 B1
(45) Date of Patent: Jun. 28, 2005

(54) TECHNIQUES FOR PRELOADING DATA INTO MEMORY ON PROGRAMMABLE CIRCUITS

(75) Inventors: Yan Chong, Mountain View, CA (US);
Chiakang Sung, Milpitas, CA (US);
Joseph Huang, San Jose, CA (US);
Philip Pan, Fremont, CA (US);
Johnson Tan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/646,538

(22) Filed: Aug. 22, 2003

(51) Int. Cl.[7] .............................................. G11C 7/00
(52) U.S. Cl. .......................... 365/189.02; 365/189.12; 365/221
(58) Field of Search ................. 365/189.02, 189.12, 365/221, 230.02, 230.03, 220, 230.01, 233, 236

(56) References Cited

U.S. PATENT DOCUMENTS

| | | | | |
|---|---|---|---|---|
| 5,977,791 A | * | 11/1999 | Veenstra | 326/40 |
| 6,094,064 A | * | 7/2000 | Mejia et al. | 326/39 |
| 6,286,114 B1 | * | 9/2001 | Veenstra et al. | 714/39 |
| 6,492,833 B1 | * | 12/2002 | Asson et al. | 326/41 |
| 6,766,505 B1 | * | 7/2004 | Rangan et al. | 716/16 |

OTHER PUBLICATIONS

Altera Corporation, "Stratix Architecture", Apr. 2003.

* cited by examiner

*Primary Examiner*—Thong Q. Le
(74) *Attorney, Agent, or Firm*—Townsend and Townsend and Crew LLP; Steven J. Cahill

(57) ABSTRACT

Techniques for preloading data into memory blocks on a programmable circuit are provided. Memory blocks on the a programmable circuit each have dedicated circuitry that loads data into the memory block. The dedicated circuit also generates memory addresses used to load the data into the memory block. The dedicated circuitry associated with each memory block reduces demand on the routing resources. A user can preload data into the memory blocks prior to user mode. A user can also prevent data from being preloaded into one or more of the memory blocks prior to user mode. By allowing the user to program some or all of the memory blocks prior to user mode, the time needed to a program the memory blocks prior to user mode can be substantially reduced.

19 Claims, 6 Drawing Sheets

TECHNIQUES FOR PRELOADING DATA INTO MEMORY ON PROGRAMMABLE CIRCUITS

BACKGROUND OF THE INVENTION

The present invention relates to techniques for preloading data into memory on programmable circuits, and more particularly, to techniques for allowing a user to selectively program on-chip memory blocks in a programmable circuit before the start of user mode.

Programmable integrated circuits (ICs) contain programmable digital circuitry that can be configured to implement a variety of user designs. After the programmable IC is configured according to a user design, a user operates the programmable IC in a selected application. The user-configured operation of the programmable IC is referred to as user mode. Programmable integrated circuits include field programmable gate arrays (FPGAs), programmable logic devices (PLDs), configurable logic arrays, programmable logic arrays (PLAs), etc.

Programmable integrated circuits include numerous programmable circuit elements such as logic elements and memory blocks. Altera Corporation manufactures a family of PLDs referred to as the Stratix PLDs. The Stratix PLDs include large memory blocks referred to as MRAM blocks.

MRAM locks can be programmed in the user mode. The data bits are transmitted to the MRAM block along a large number of routing wires. A separate set of routing wires are needed to transmit memory address signals to the MRAM blocks.

The large number of data and address routing wires needed to program the MRAMs are cumbersome and taken up a large amount of the routing resources on programmable ICs that have large MRAM blocks. Also, it takes a relatively long time to program many large MRAMs on a programmable IC.

Therefore, it would be desirable to provide techniques for preloading data into memory blocks on a programmable IC that saves time and reduces demand on the routing resources.

BRIEF SUMMARY OF THE INVENTION

The present invention provides techniques for preloading data into memory blocks on a programmable circuit. According to the present invention, memory blocks on the programmable circuit each have dedicated circuitry that preloads data into the memory block. The dedicated circuitry also generates memory addresses used to store the data in the memory block. The dedicated circuitry associated with each memory block reduces demand on the routing resources.

A user can selectively preload data into one or more of the memory blocks on the programmable IC prior to the user mode. A user can decide not to preload data into any one of the memory blocks prior to user mode. The memory blocks can be used as random-access memory (RAM) or read-only memory (ROM) during user mode. By allowing the user to prevent the programming of one or more of the memory blocks prior to user mode, programming time is substantially reduced, because data is not transferred to memory blocks that do not need to be programmed.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
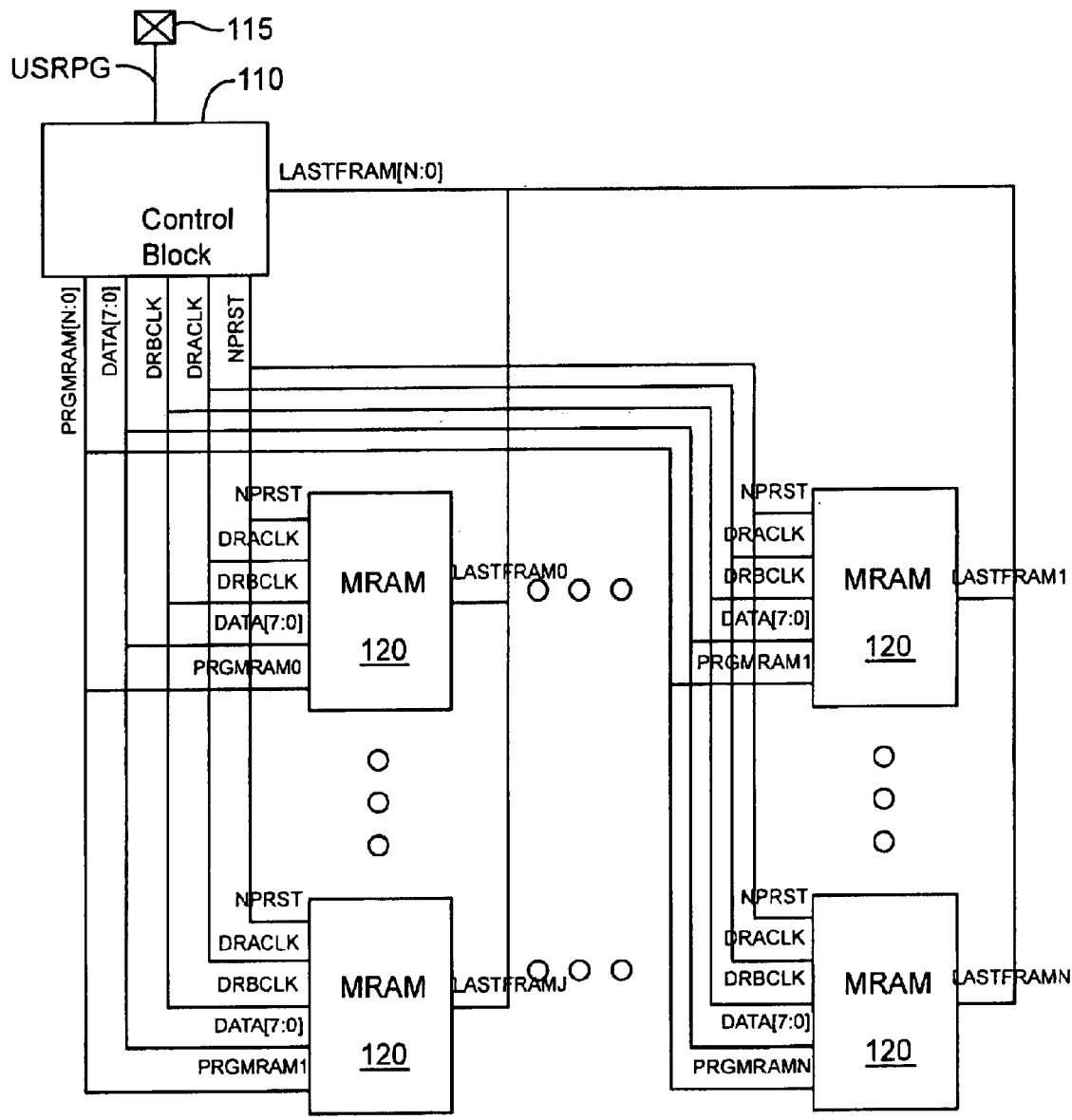
FIG. 1 illustrates a control block and four memory blocks on a programmable integrated circuit according to the present invention.

FIG. 1 is a block diagram of selected circuit blocks on a programmable integrated circuit (IC) that are related to the present invention. FIG. 1 illustrates a control block 110 and Mega RAM (MRAM) blocks 120. A programmable IC can include any desired number N of MRAM blocks (e.g., 4, 6 or 8). Four MRAM are illustrated in FIG. 1 merely to simplify the diagram.

Programmable integrated circuits of the present invention include, for example field programmable gate arrays (FPGAs), programmable logic devices (PLDs), configurable logic arrays, programmable logic arrays (PLAs), etc.

Each MRAM block 120 includes numerous RAM memory cells. MRAM blocks 120 can include any number of memory cells (e.g., 1152). MRAM blocks 120 can be programmed before user mode or during user mode. A user can program a subset of MRAM blocks 120 before user mode. Alternatively, a user can program all or none of MRAM blocks 120 before user mode. Control block 110 can be a small processor or processing unit.

The present invention provides users with the flexibility of loading data into some, all, or none of MRAM blocks 120 prior to the start of user mode. The present invention can reduce the time it takes to configure memory on a programmable IC, because a user can prevent data from being transferred to the MRAM blocks that do not need to be configured prior to the start of user mode.

When MRAM blocks 120 are configured before the programmable IC is implemented in user mode, MRAM blocks 120 can be used as ROM or RAM during the user mode. When MRAM blocks 120 are not configured before the programmable IC is implemented in user mode, MRAM blocks 120 can be used as RAM during the user mode.

Data bits labeled DATA[7:0] are transferred from control block 110 to MRAM blocks 120 via routing wires (signal lines) shown in FIG. 1. Data bits DATA[7:0] can be loaded into selected MRAM blocks 120 before the commencement of the user mode. A user can load data bits DATA[7:0] into the programmable IC from an input pin (not shown).

Program signals PRGMRAM[N:0] are bits that select which of MRAM blocks 120 are programmed prior to the start of user mode. Pin 115 in FIG. 1 is an input pin on the programmable IC. A user can apply signal USRPG to pin 115. Signal USRPG is transmitted to control block 110 from pin 115. Signal USRPG can include a plurality of bits. If desired, USRPG can be input from more than one input pin on the programmable IC. The USRPG signal (or signals) determines the state of bits in signal PRGMRAM[N:0]. Thus, a user can indicate to the programmable IC which one of MRAM block 120 are to going to be programmed prior to the user mode by applying the USRPG signal at pin 115.

Control block 110 outputs signal PRGMRAM[N:0], DATA[7:0], DRBCLK, DRACLK, and NPRST. These signals are transmitted to each of the MRAM blocks 120. Further details of the functions performed by these signals are discussed below in the context of FIG. 2.

Figure 2:
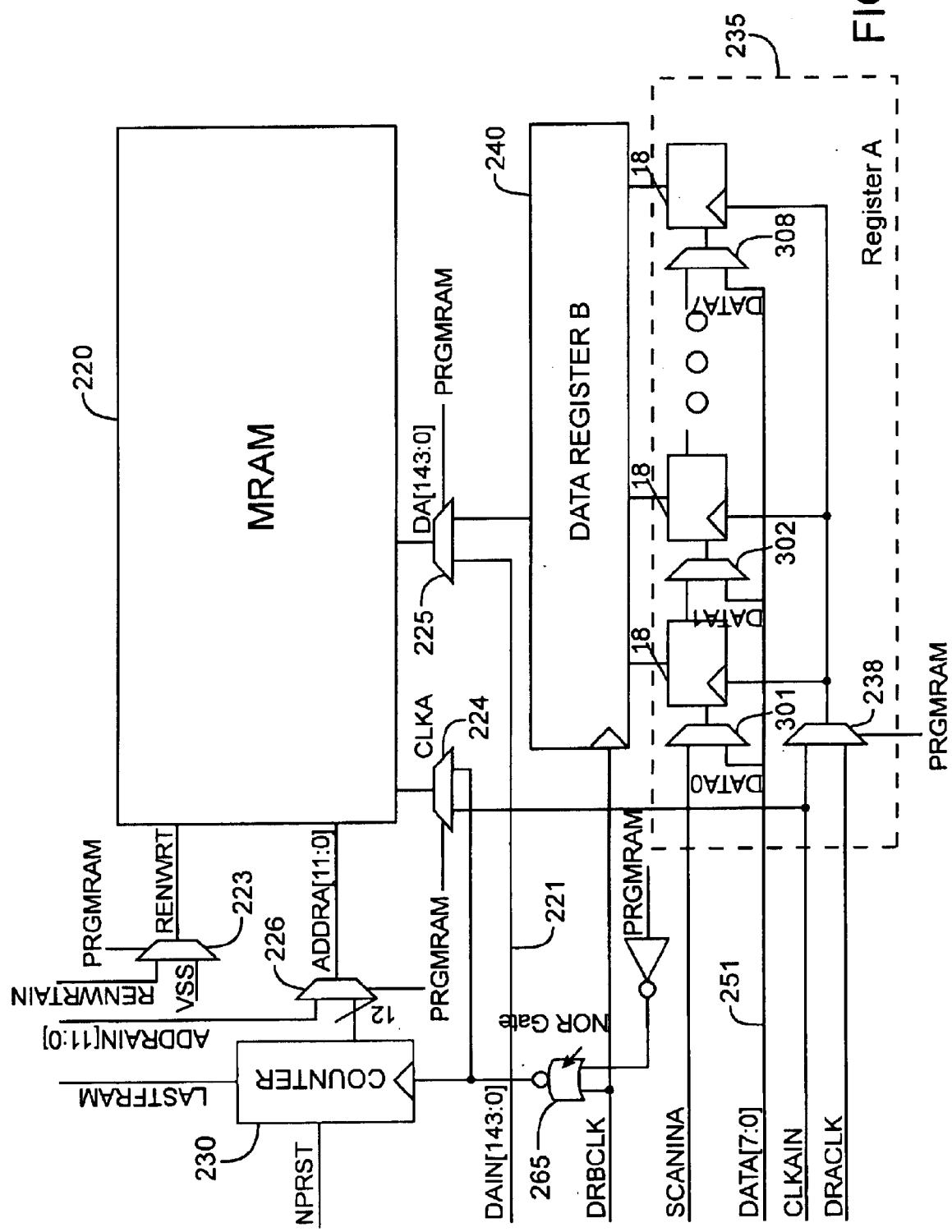
FIG. 2 illustrates a block diagram of a memory block and its associated dedicated circuitry for preloading data into the memory block according to the present invention.

FIG. 2 illustrates a more detailed diagram of an MRAM block 220 and dedicated circuitry that is configured to preload data into MRAM 220 according to an embodiment of the present invention. The dedicated circuitry includes multiplexers 223–226, registers 235 and 240, and address counter 230. MRAM 220 is an example MRAM blocks 120 on the programmable IC.

Data can be loaded into MRAM 220 using two separate data paths. One of the two data paths is selected depending upon whether MRAM 220 is programmed before user mode or during the user mode. If a user wants to program MRAM 220 before that start of user mode, data bits are preloaded from control block 110 along 8 routing wires (i.e., signal lines) 251 into MRAM 220. When data bits DATA[7:0] are preloaded into MRAM 220, MRAM 220 can be used as a ROM or a RAM block in user mode.

In the example of FIG. 2, MRAM 220 is a 144 bit width memory block. Only 8 signal lines 251 (instead of 144) are used to preload data into MRAM 220 to reduce the demand placed on the routing resources. Thus, the present invention uses less wires to reload data into MRAM 220 before the start of the user mode.

If the user wants to program MRAM 220 during user mode, data bits DAIN[143:0] are loaded into MRAM 220 on 144 parallel signal lines 221. During user mode, data bits DAIN[143:0] can be loaded from programmable logic elements in the IC into MRAM 220 along signal lines 221. Data bits can also be read from MRAM 220 and transferred to programmable logic elements in the IC during user mode. Substantially more routing wires are used to load data into MRAM 220 during user mode.

Enable signal PRGMRAM is provided to select inputs of multiplexer 223–226. Enable signal PRGMRAM include N bits, where N is the number of MRAM blocks in the programmable IC. Each bit in PRGMRAM corresponds to one of the MRAM blocks 120 on the IC.

Prior to the user mode, control block 110 can pull one of the PRGMRAM bits HIGH to preload data into the corresponding MRAM block along signal lines 251. The PRGMRAM bit that is pulled HIGH corresponds to the MRAM block that is currently selected to load data into. For example, if data is being loaded from control block 110 into the first MRAM block in the IC, the first bit in PRGMRAM is pulled HIGH. Data is then preloaded into that MRAM block along line 251 from control block 110.

Multiplexer 225 controls which set of data bits are coupled to the data inputs of MRAM 220. When the corresponding PRGMRAM bit is LOW, multiplexer 225 couples its output to signal lines 221. During user mode, data bits DAIN[143:0] are loaded into MRAM 220 when multiplexer 225 selects signal lines 221.

Multiplexer 224 selects clock signal CLKAIN when the corresponding PRGMRAM bit is LOW. Clock signal CLKAIN is a timing signal that controls the loading of data bits DAIN[143:0] into MRAM 220 during user mode.

When the corresponding PRGMRAM bit is HIGH, multiplexer 225 couples its output to register 240. Data bits DATA[7:0] are preloaded from signal lines 251 to register B 240 and then into MRAM 220, as will now be discussed in further detail.

Data bits DATA[7:0] are initially preloaded into registers A 235 and B 240 before they are loaded in MRAM 220. Data clock signal DRACLK is a timing signal that controls the loading of data bits DATA[7:0] into register A 235. Data block signal DRBCLK is a timing signal that controls the loading of these data bits from register A 235 to register B 240.

Figure 3:
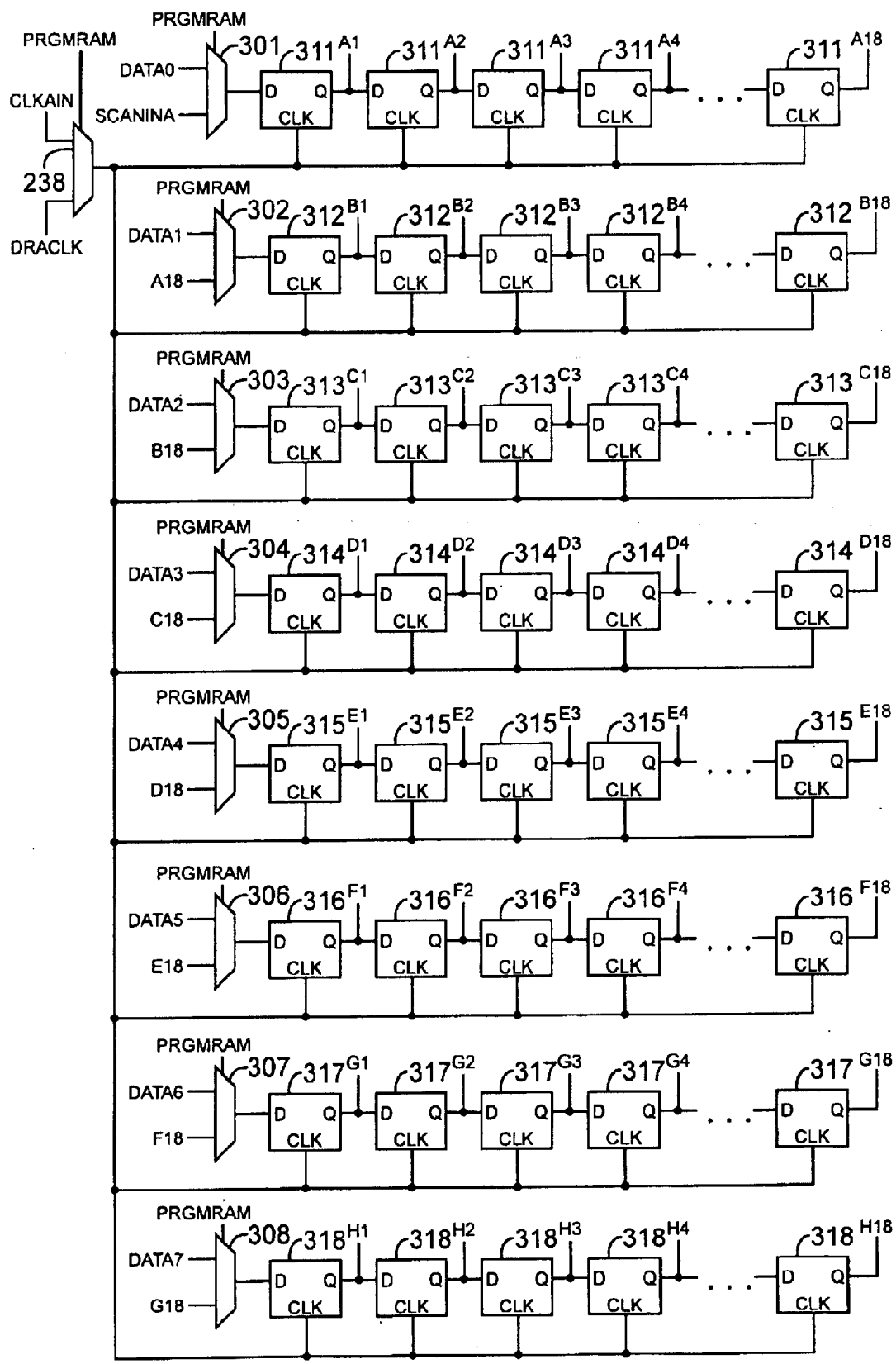
FIG. 3 illustrates the shift registers that comprise a portion of dedicated circuitry associated with a memory block according to the present invention.

FIG. 3 illustrates a more detailed diagram of register A 235. Register 235 includes 8 sets of 18 D flip-flops. Register 235 has a first set of 18 flip-flops 311, a second set of 18 flip-flops 312, a third set of 18 flip-flops 313, a fourth set of 18 flip-flops 314, a fifth set of 18 flip-flops 315, a sixth set of 18 flip-flops 316, a seventh set of 18 flip-flops 317, and an eighth set of 18 flip-flops 318. Thus, register 235 has 144 total flip-flops 311–318 as shown in FIG. 3. Each of the eight sets of 18 flip-flops 311–318 is a shift register.

Multiplexer 238 selects one of clock signals DRACLK or CLKAIN. Enable signal PRGMRAM controls which clock signal multiplexer 238 selects. Enable signal PRGMRAM causes multiplexer 238 to select clock signal DRACLK to preload data from wires 251 into MRAM 220 before user mode.

Enable signal PRGMRAM also controls multiplexers 301–308. Enable signal PRGMRAM causes multiplexers 301–308 to select data bits DATA1–DATA7, respectively, when controlled block 110 is ready to preload data into MRAM 220.

Data bits are serially transferred from control block 110 to MRAM 220 on 8 parallel signal lines 251. The data bits are transferred in serial through multiplexers 301–308 and into flip-flops 311–318.

Clock signal DRACLK shifts the serially transferred data bits DATA[7:0] through shift register 311–318. Serial data bits DATA0 are shifted through flip-flops 311 on each rising edge of DRACLK. Serial data bits DATA1–DATA7 are shifted through flip-flops 312–318, respectively, on each rising edge of DRACLK.

Eighteen serial data bits DATA[7:0] on each of the 8 lines 251 are serially shifted into registers 311–318. Each of the 18 flip-flops in the 8 shift registers 311–318 stores one of the 18 serially transferred data bits from one of signal lines 251. A total of 144 bits are stored in registers 311–318.

The 18 serial data bits stored in shift registers 311 are signals A1–A18 in FIG. 3. The 18 serial data bits stored in shift registers 312–318 are signals B1–B18, C1–C18, D1–D18, E1–E18, F1–F18, G1–G18, and H1–H8, respectively, in FIG. 3.

All 144 data bits A1–H18 are then transferred to register B 240 as 144 parallel data bits on the next rising edge of the data register B clock signal DRBCLK. Thus, shift registers 311–318 perform the function of a serial-to-parallel converter.

Eight sets of 18 bit long shift registers are shown in FIG. 3 to illustrate one embodiment of the present invention. Any number of shift registers can be used to convert the serial data bits to parallel data bits. Also, the shift register can have any desired bit length. The bit length of the shift registers can be increased to further reduce the demand on routing resources at the expense of an increased circuit area and die size.

In the embodiment of FIG. 2, register B 240 includes 144 D flip-flops. Each of the flip-flops in register B 240 are coupled to the outputs of one of the 144 flip-flops in register A 235. However, register 240 can have any number of flip-flops or other storage elements depending upon the bit length of the parallel data generated by register 235.

Each flip-flop in register B 240 stores one of the bits A1–H18 for one clock cycle of DRBCLK. The bits A1–H18 are then transferred from register 240 to MRAM 220. Clock signal DRBCLK controls the shifting the data signals A1–H18 through the 144 flip-flops in register 240 and into MRAM 220 through multiplexer 225. Multiplexer 225 selects data register B 240 in the preload mode.

Figure 4:
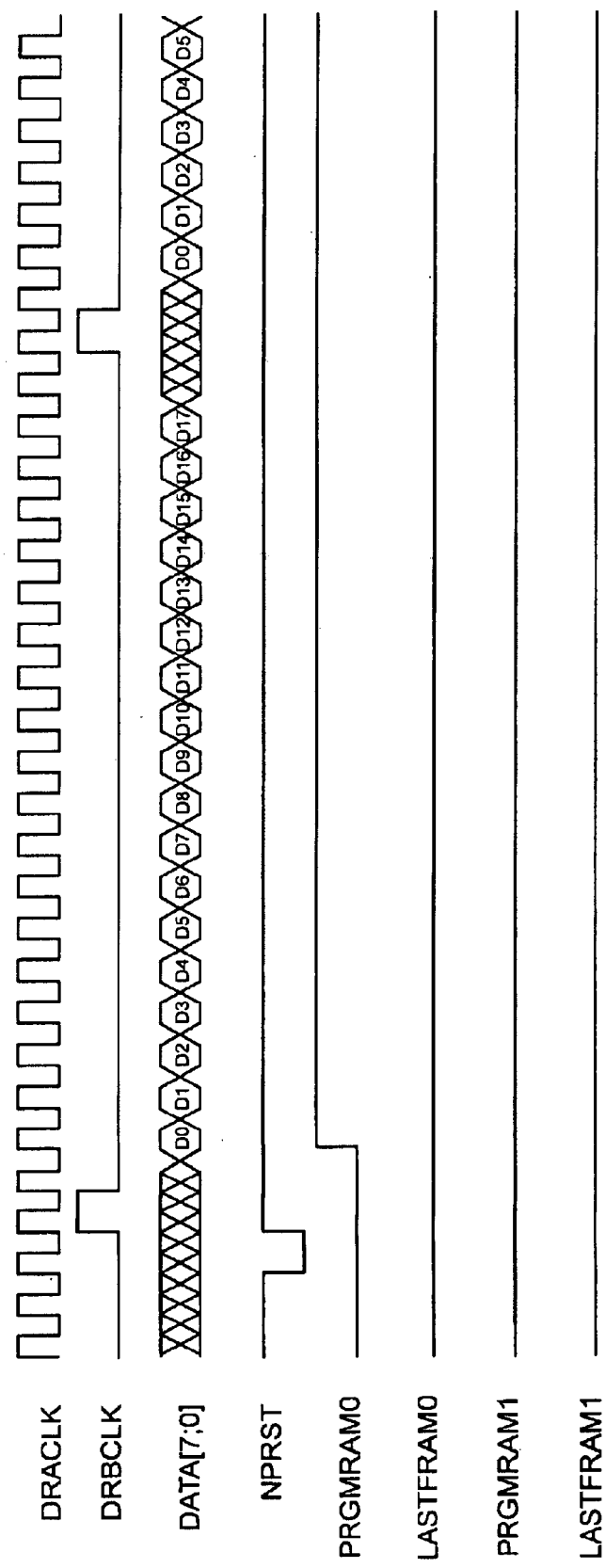
FIG. 4 illustrates a timing diagram of signals used to preload data into a memory block on a programmable integrated circuit according to the present invention.

FIG. 4 is a timing diagram that further illustrates how data signals DATA[7:0] are preloaded in to MRAM 220 prior to user mode. FIG. 4 illustrates clock signals DRACLK and DRBCLK as well as data signals DATA[7:0]. The period of DRACLK corresponds to the period of each data bit DATA[7:0]. 18 of data bits DATA[7:0] are serially shifted into each set of shift registers in register A 235 before they are shifted out of register A as 144 parallel bits as discussed above. Therefore, the period of DRBCLK is at least 18 times as long as the period of DRACLK.

In the embodiment shown in FIG. 4, the period DRBCLK is 21 times as long as the period of DRACLK. The three extra DRACLK clock periods are added to the period of DRBCLK to provide time to load the 144 data bits into MRAM 220. MRAM 220 preferably includes address decoders. The additional clock periods provide extra time to decode the memory addresses and to load the data bits into memory cells within MRAM 220.

MRAM block 220 needs memory address signals to be able to store data bits in the proper memory cells. Counter 230 is designed to generate memory address signals during the preload mode at its 12-bit output signal, when data bits DATA[7:0] are preloaded into MRAM 220. Counter 230 generates a 12 bit binary address signal that is transferred to MRAM 220 through multiplexer 226. A corresponding bit of enable signal PRGMRAM causes multiplexer 226 to select the output of counter 230 during the preload mode.

Clock signal DRBCLK, which is generated by control block 110, controls counter 230. DRBCLK is inverted by the NOR gate 265. NOR gate 265 is coupled to the clock input of counter 230. A second input of NOR gate 265 is coupled to receive the PRGMRAM signal through an inverter. When the corresponding bit of PRGMRAM is LOW, address counter 230 does not change its 12-bit output signal, because NOR gate 265 blocks DRBCLK. Clock signal DRBCLK can only cause counter 230 to begin to increase its 12-bit output signal when the corresponding bit of PRGMRAM is HIGH.

Control block 110 also generates preset signal NPRST. When NPRST goes LOW, the 12 bit address output signal of counter 230 is reset to 12 zeros (000000000000). Then, on each subsequent falling edge of DRBCLK the binary value of the address signal of counter 230 increases by one bit. Counter 230 is capable of generating 4096 unique addresses.

MRAM 220 includes a decoder that decodes the address signals from the counter. MRAM 220 uses each decoded address generated by counter 230 to store a data bit into a memory cell that corresponds to the address. The present invention can store multiple data frames from control block 110 into MRAM block 220.

For example, when PRGMRAM0 goes HIGH as shown in FIG. 4, data bits DATA[7:0] from control block 110 are loaded into the first MRAM 220. A data frame can be, e.g., 144 bits long. The number of data frames that can be stored in MRAM 220 is limited by the size of MRAM 220. As a specific example, MRAM 220 can have a memory size of 8×144 for a maximum of eight 144-bit long data frames (1152 bits) that can be stored in MRAM 220.

Counter 230 stores a maximum address that corresponds to the last bit can be stored in MRAM 220 before MRAM 220 is full. In above example, counter 230 can generate 4096 unique address, but MRAM 220 can only stored 1152 bits. Therefore, counter 230 reaches the maximum address of MRAM 220 long before counter 230 generates all 4096 addresses.

When counter 230 generates the last address of MRAM 220, a corresponding bit in the last frame signal LASTFRAM[N:0] goes HIGH. When one of the N bits in LASTFRAM goes HIGH, control block 110 determines that the corresponding MRAM block is full. Control block 110 then causes the next bit in the PRGMRAM signal to go HIGH, so that the next set of data bits DATA[7:0] can be stored in the next MRAM block. N is a variable that indicates the number N of MRAM blocks in the programmable IC.

Figure 5:
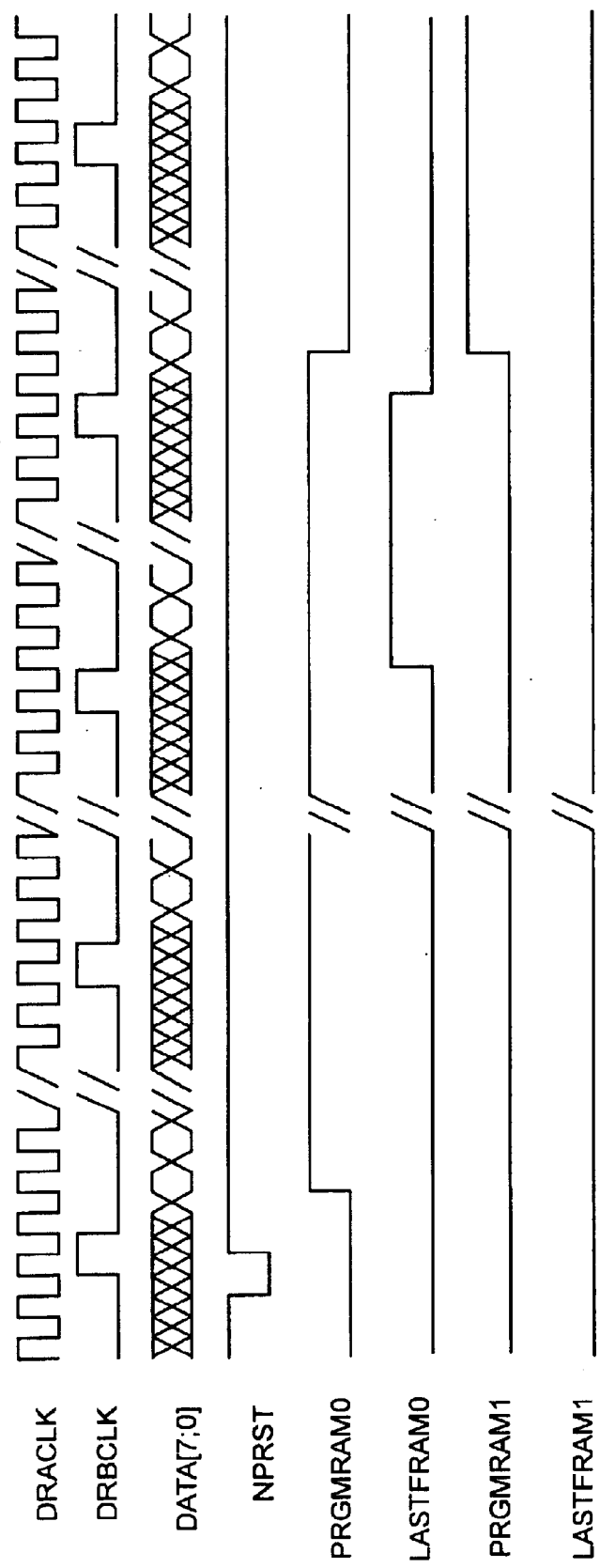
FIG. 5 illustrates a second timing diagram of signals used to preload data into a memory block on a programmable integrated circuit according to the present invention.

FIG. 5 is another timing diagram that illustrates an entire cycle of one of the enable bits PRGMRAM0. As shown in FIG. 5, after the bit of the last frame signal LASTFRAM0 goes HIGH, control block 110 pulls the first bit of the enable signal PRGMRAM0 low. When PRGMRAM0 goes LOW, multiplexers 223–226, 238, and 301–308 prevent any more of data bits DATA[7:0] from being stored in the first MRAM block.

Subsequently, the second bit of the enable signal PRGMRAM1 goes HIGH, causing the multiplexers in the second MRAM block to change state, if the USRPG signal indicates that the user wants to program the second MRAM before user mode. Data bits DATA[7:0] are then stored in the second MRAM block.

If the USRPG indicates that the user does not want to program the second MRAM, the second bit PRGMRAM1 remains LOW, and data is not preloaded into the second MRAM. The third bit PRGMRAM2 goes HIGH if USRPG indicates the user wants to program the third MRAM block prior to user mode. Data is then preloaded into the third MRAM block. If USPRG indicates that the user does not want to program the third MRAM block prior to user mode, PRGMRAM2 remains LOW and data bits are not preloaded into the third MRAM block. Thus, the user has the option of preloading data into any selected MRAM blocks by setting the state of USPRG.

When MRAM 220 is operated as a SRAM in user mode, data bits can be loaded into MRAM 220 from the logic elements. The data bits DAIN[143:0] from the logic elements are loaded into MRAM 220 along signal lines 221 through multiplexer 225. In user mode multiplexer 225 selects signal lines 221, because all of the PRGMRAM bits are LOW.

In user mode, multiplexer 226 selects the ADDRAIN [11:0]signal, because all the PRGMRAM bits are LOW. The ADDRAIN[11:0] signal includes 12 memory address bits. These memory address bits indicate the memory locations where data bits on signal lines 221 are to be loaded into MRAM 220. Logic elements that are configured in the user design generate the ADDRAIN signal.

The REWRT signal tells MRAM 220 whether to read or to write data into its memory cells. When REWRT is LOW, MRAM 220 is in write data mode. When REWRT is HIGH, MRAM 220 is in read data mode. Prior to user mode, multiplexer 223 selects the low supply voltage VSS when a corresponding bit of the enable signal PRGMRAM is HIGH. By selecting the low supply voltage, MRAM 220 is locked into write mode before user mode, while data bits are preloaded in from signal lines 251.

During the user mode, multiplexer 223 selects the RENWRTAIN signal, because all of the PRGMRAM bits are LOW. Logic elements that are configured in the user design generate the RENWRTAIN signal. These logic elements pull the RENWRTAIN signal HIGH to read data from MRAM 220 and pull REWRTAIN LOW to write data into MRAM 220. If MRAM 220 is configured to operate as a ROM during user mode, these logic element keep the RENWRTAIN signal HIGH throughout the user mode.

The present invention provides techniques for storing data into MRAM memory blocks on a programmable IC. Data can be stored into the MRAM blocks prior to user mode so that the MRAM can operate as a ROM or a RAM in user mode. The data is transferred serially to shift registers on a small number of routing wires and then converted to parallel data. This technique substantially reduces the demand on the routing resources.

Data can also be loaded into and read from the MRAM blocks when they are operated as RAMs in user mode. The circuitry associated with each of the MRAM blocks allows a user to load data into less than all of the MRAM blocks on the programmable IC prior to user mode. These features of the present invention allow a first subset of the MRAM blocks to be preloaded with data prior to user mode, while a second subset of the MRAMs are not preloaded with data prior to user mode. This technique substantially reduces memory program time.

Figure 6:
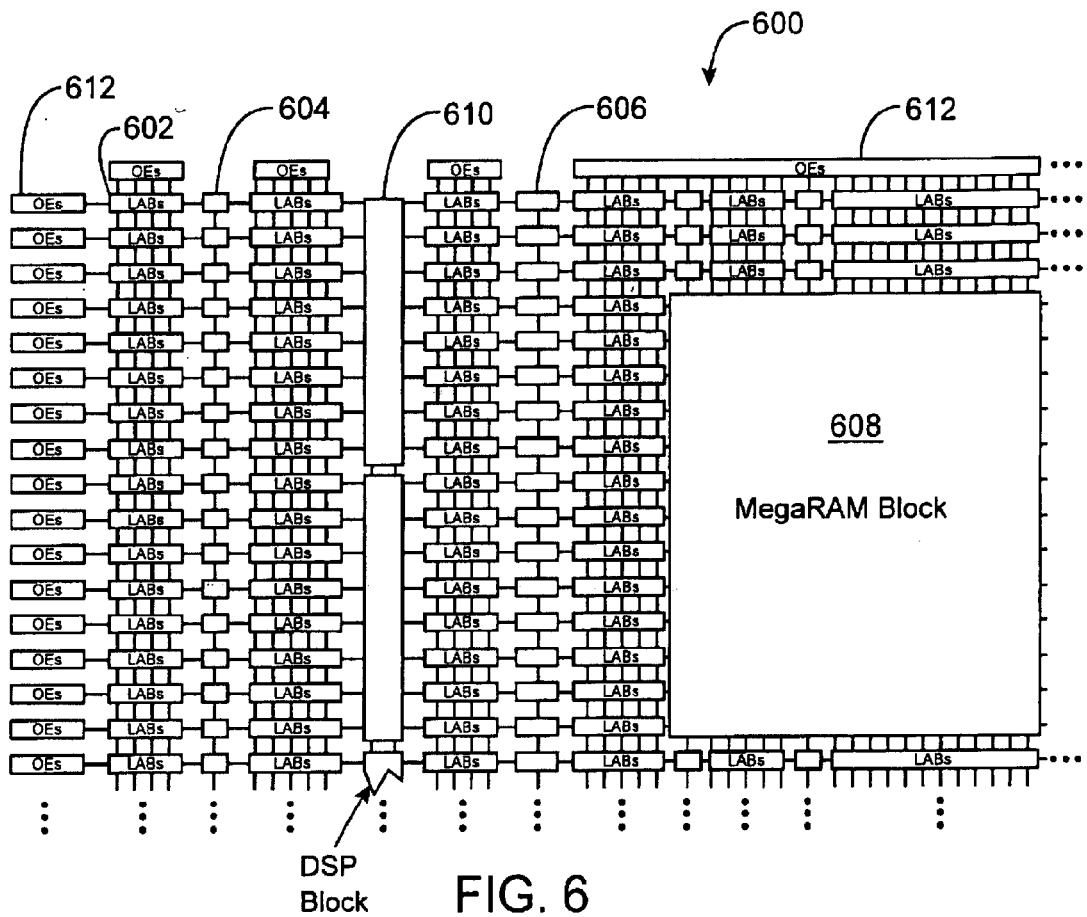
FIG. 6 is a simplified block diagram of a programmable logic device that can implement embodiments of the present invention.

FIG. 6 is a simplified partial block diagram of an exemplary high-density PLD 600. Techniques of the present invention can be utilized in a PLD such as PLD 600. PLD 600 includes a two-dimensional array of programmable logic array blocks (or LABs) 602 that are interconnected by a network of column and row interconnects of varying length and speed. LABs 602 include multiple (e.g., 10) logic elements (or LEs). An LE is a small unit of logic that provides for efficient implementation of user defined logic functions.

PLD 600 also includes a distributed memory structure including RAM blocks of varying sizes provided throughout the array. The RAM blocks include, for example, 512 bit blocks 604, 4K blocks 606 and a MRAM Block 608 providing 512K bits of RAM. These memory blocks may also include shift registers and FIFO buffers. PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 7:
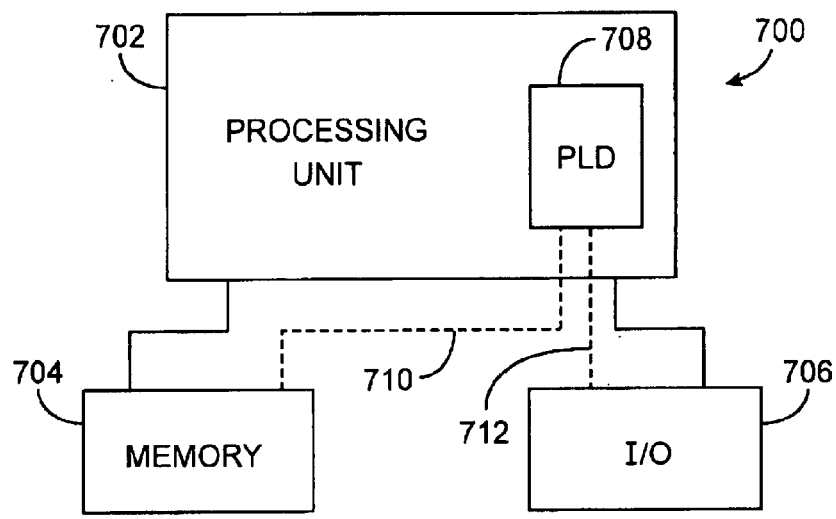
FIG. 7 is a block diagram of an electronic system that can implement embodiments of the present invention.

While PLDs of the type shown in FIG. 6 provide many of the resources required to implement system level solutions, the present invention can also benefit systems wherein a PLD is one of several components. FIG. 7 shows a block diagram of an exemplary digital system 700, within which the present invention may be embodied. System 700 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 700 may be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 may be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 may be a central processing unit (CPU), microprocessor, floating point coprocessor, graphics coprocessor, hardware controller, microcontroller, programmable logic device programmed for use as a controller, network controller, and the like.

Furthermore, in many embodiments, there is often no need for a CPU. For example, instead of a CPU, one or more PLDs 708 can control the logic operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications can be made to adapt a particular configuration or method disclosed, without departing from the essential scope and spirit of the present invention. It is intended that the invention not be limited to the particular embodiments disclosed, but that the invention will include all embodiments and equivalents falling with the scope of the claims.

What is claimed is:

1. A method for storing data into memory blocks on a programmable integrated circuit configured to implement a user design and operated according to the user design in a user mode, the method comprising:

transferring a first set of data bits from an input pin to a plurality of shift registers on the programmable integrated circuit;

if an enable signal is in a first state, selecting the first set of data bits using a first multiplexer and preloading the first set of data bits into a memory block prior to the user mode; and if the enable signal is in a second state, preventing the first set of data bits from being preloaded into the memory block using the first multiplexer prior to the user mode.

2. The method as defined in claim 1 further comprising:
transferring a second set of data bits from the input pin to the shift registers on the programmable integrated circuit;
if a second enable signal is in a first state, selecting the second set of data bits using a second multiplexer and preloading the second set of data bits into a second memory block prior to the user mode; and
if the second enable signal is in a second state, preventing the second set of data bits from being preloaded into the second memory block using the first multiplexer prior to the user mode.

3. The method as defined in claim 1 further comprising:
selecting a second set of data bits using the first multiplexer and storing the second set of data bits in the memory block when the enable signal is in the second state during the user mode.

4. The method as defined in claim 3 further comprising:
selecting a first block signal using a second multiplexer if the enable signal is in the first state, wherein the first set of data is preloaded into the memory block in response to the first clock signal prior to the user mode; and
selecting a second clock signal using the second multiplexer if the enable signal is in the second state, wherein the second set of data is stored in the memory block in response to the second clock signal during the user mode.

5. The method as defined in claim 1 wherein transferring the first set of data bits to the plurality of shift registers further comprises:
transferring the first set of data as serial data on first signal lines;
shifting the first set of data through the plurality of shift registers in response to a first clock signal; and
outputting the first set of data as parallel data from the plurality of shift registers on second signal lines, the first signal lines being less than the second signal lines.

6. The method as defined in claim 5 further comprising:
storing the parallel data in a plurality of flip-flops that are coupled to a second clock signal,
wherein the first set of data is preloaded into the memory block in response to the second clock signal.

7. The method as defined in claim 1 further comprising:
generating first memory address signals using a counter circuit;
selecting the first memory address signals using a second multiplexer if the enable signal is in the first state; and
decoding the first memory address signals, wherein the first set of data bits are preloaded into the memory block prior to the user mode in memory cells selected by the decoded first memory address signals.

8. The method as defined in claim 7 further comprising:
selecting a second set of data bits using the first multiplexer;
selecting second memory address signals generated by logic elements in the programmable integrated circuit using the second multiplexer when the enable signal is in the second state;
decoding the second memory address signals; and
storing the second set of data bits in the memory block in memory cells selected by the decoded second memory address signals when the enable signal is in the second state during the user mode.

9. The method as defined in claim 7 further comprising:
selecting a power supply voltage using a third multiplexer if the enable signal is in the first state; and
providing the power supply voltage to a read/write input of the memory block.

10. The method as defined in claim 1 wherein transferring the first set of data bits from the input pin to the plurality of shift registers further comprises transferring the first set of data bits to the shift registers using a control block.

11. A programmable integrated circuit configured to implement a user design and operated according to the user design in a user mode, the programmable integrated circuit comprising:
a first memory block;
a control block that provides a first enable signal prior to the user mode;
a shift register that converts first data bits into parallel data, the shift register comprising at least two serially coupled flip-flops, wherein a data output of the first flip-flop is coupled to a data input of the second flip-flop;
a first register that is coupled to receive the first data bits as parallel data from the shift register and that stores first data bits prior to the user mode if the first enable signal is in a first state; and
a first multiplexer that couples to an output of the first register to a data input of the first memory block if the first enable signal is in the first state, wherein the first data bits are preloaded into the first memory block prior to the user mode only if the first multiplexer selects the first data bits.

12. The programmable integrated circuit according to claim 11 further comprising:
a second memory block, wherein the control block provides a second enable signal prior to the user mode;
a second register that stores second data bits prior to the user mode if the second enable signal is in a first state; and
a second multiplexer that couples an output of the first register to a data input of the second memory block if the second enable signal is in the first state, and the second data bits are preloaded into the second memory block prior to the user mode only if the second multiplexer selects the second data bits.

13. The programmable integrated circuit according to claim 11 wherein the first multiplexer selects second data bits transmitted from logic elements when the first enable signal is in a second state during the user mode.

14. The programmable integrated circuit according to claim 13:
wherein the shift register further comprises a third flip-flop having a data input coupled to a data output of the second flip-flop.

15. The programmable integrated circuit according to claim 13 further comprising:
a second multiplexer coupled to programmably select a first clock signal or a second clock signal in response to the first enable signal to provide a selected clock signal, wherein the selected clock signal controls shifting of the first data bits through the shift register.

16. The programmable integrated circuit according to claim 13 further comprising:
a second multiplexer coupled to programmably select a first clock signal or a second clock signal in response to the first enable signal to provide a selected clock signal, wherein the selected clock signal controls loading data bits into the first memory block.

17. A programmable integrated circuit configured to implement a user design and operated according to the user design in a user mode, the programmable integrated circuit comprising:

a first memory block;

a control block that provides a first enable signal prior to the user mode;

a first register that stores first data bits prior to the user mode if the first enable signal is in a first state;

a first multiplexer that couples to an output of the first register to a data input of the first memory block if the first enable signal is in the first state, wherein the first data bits an preloaded into the first memory block prior to the user mode only if the first multiplexer selects the first data bits;

a counter circuit that generates first memory addresses; and a second multiplexer coupled to the counter circuit and an address input of the first memory block, wherein the second multiplexer programmably selects the first memory addresses or second memory addresses transmitted from one or more logic elements in response to the first enable signal.

18. The programmable integrated circuit according to claim 17 wherein the counter circuit generates a last frame signal when all of the first data bits have been preloaded into the first memory block, a second enable signal changing state in response to the last frame signal causing second data bits to be preloaded into a second memory block prior to the user mode.

19. The programmable integrated circuit according to claim 13 further comprising:

a second multiplexer coupled to a read/write input of the first memory block that programmably selects a supply voltage or a read/write signal in response to the first enable signal, wherein the second multiplexer selects the supply voltage prior to the user mode when the enable signal is in the first state.

* * * * *

UNITED STATES PATENT AND TRADEMARK OFFICE
CERTIFICATE OF CORRECTION

PATENT NO.    : 6,912,164 B1
DATED         : June 28, 2005
INVENTOR(S)   : Yan Chong et al.

It is certified that error appears in the above-identified patent and that said Letters Patent is hereby corrected as shown below:

<u>Title page,</u>
Item [57], ABSTRACT,
Line 12, replace "time needed to a program" with -- time needed to program --.

<u>Column 9,</u>
Line 20, replace "block" with -- clock --.

<u>Column 10,</u>
Line 27, replace "couples to an output" with -- couples an output --.

<u>Column 11,</u>
Line 12, delete "to".
Line 15, replace "an" with -- are --.

Signed and Sealed this

Seventh Day of February, 2006

JON W. DUDAS
*Director of the United States Patent and Trademark Office*